United States Patent [19]

Peterson

[11] Patent Number: 4,681,549
[45] Date of Patent: Jul. 21, 1987

[54] PRINTED CIRCUIT BOARD EDGE CONNECTION ARRANGEMENTS

[75] Inventor: Olav Peterson, Ontario, Canada

[73] Assignee: Northern Telecom Limited, Montreal, Canada

[21] Appl. No.: 398,248

[22] Filed: Jul. 14, 1982

[51] Int. Cl.[4] ............................................. H01R 13/53
[52] U.S. Cl. .................................................... 439/181
[58] Field of Search ........................................ 339/111

[56] References Cited

U.S. PATENT DOCUMENTS 3,973,817  8/1976  Stalley et al. ............... 339/17 LC X

OTHER PUBLICATIONS

John Stark, Jr. et al. "Kine Socket Assembly With Arc Protection", *RCA Technical Notes,* TN No. 835, May 14, 1969.

D. W. Davenport et al. "Arc Suppressing Connector", *IBM Technical Disclosure Bulletin,* vol. 25, No. 1, p. 405, Jun. 1982.

*Primary Examiner*—Gil Weidenfeld
*Assistant Examiner*—Steven C. Bishop
*Attorney, Agent, or Firm*—R. John Haley

[57] ABSTRACT

Arcing between a connection pad of a PCB (printed circuit board) and a contact of a connector on insertion and removal of the PCB from the connector is avoided by terminating the pad before the connection edge of the PCB, and by-passing the connection with a second connection comprising another contact of the connector, another pad of the PCB extending to the connection edge of the PCB, and a series resistor. The resistor can be mounted on either the PCB or the connector.

6 Claims, 4 Drawing Figures

PRINTED CIRCUIT BOARD EDGE CONNECTION ARRANGEMENTS

This invention relates to printed circuit (PCB) edge connection arrangements.

In electronic equipment it is common to provide PCBs with edge connection pads, the boards being slidable on rails so that they are removably received in fixed electrical connectors for making electrical connections to the boards, thus providing a compact arrangement which facilitates maintenance and replacement of the boards.

On insertion or removal of a PCB, however, high electrical fields of the order of $10^9$ volts/meter can occur at the interface between the edge connection pads and the contacts of the connector, leading to arcing if the current permitted by the relevant circuit is sufficient to sustain an arc. As arcing has a flat frequency spectrum over a wide range, it can adversely affect the operation of adjacent wideband circuits, such as digital data circuits, and analog circuits having comparison thresholds. Consequently, arcing occurring on removal or insertion of a PCB can adversely affect the operation of circuits on adjacent PCBs.

This disadvantage is particularly significant in the case of telephone equipment, such as repeaters, in which adjacent PCBs are allocated to different channels and it is necessary to maintain normal operation of some channels while other channels are interrupted upon removal of their PCBs.

An object of this invention is to provide a PCB edge connection in which arcing can be avoided, thus eliminating the above disadvantage.

According to this invention there is provided a printed circuit board edge connection arrangement comprising a printed circuit board having first and second edge connection pads and a connector for removably receiving the board, the connector including a first contact for making a first electrical connection to the first pad, and a second contact for making a second electrical connection to the second pad, when the board is received in the connector, wherein the second pad does not extend as far towards the connection edge of the printed circuit board as the first pad, whereby the first contact makes the first electrical connection to the first pad on insertion of the board into the connector before the second contact makes the second electrical connection to the second pad, and the first contact breaks the first electrical connection to the first pad on removal of the board from the connector after the second contact breaks the second electrical connection to the second pad, and current-limiting means, connected between the first and second pads or between the first and second contacts, via which the first electrical connection is connected in parallel with the second electrical connection when the board is received in the connector, whereby arcing between the second contact and the second pad, on insertion of the board into and removal of the board from the connector, is avoided.

Thus in accordance with the invention arcing across the second electrical connection is avoided by bypassing this with the current-limited first electrical connection, which is made before and broken after the second connection. Arcing across the first connection is prevented by suitable selection of the current-limiting means to limit the current which flows through this connection on insertion or removal of the board to a value which is insufficient to sustain an arc. When the board is received in the connector in normal operation, the first connection and current-limiting means are shorted by the second connection and thus have no effect.

The first and second pads conveniently overlie one another on opposite sides of the PCB. Alternatively, they may be disposed on the same side of the PCB, either adjacent to or spaced apart from one another.

The current-limiting means conveniently comprises a resistor, but other, more complex, forms of current-limiting means may be provided if desired. The resistor is most conveniently connected on the PCB between the first and second pads, a direct connection being made or already existing between the first and second contacts. Alternatively, however, a direct connection could be made on the PCB between the pads with a resistor connected between the first and second contacts, which must not in this case be directly interconnected. As a further alternative, two resistors together constituting the current-limiting means could be provided, one connected between the first and second pads and the other connected between the first and second contacts.

The invention will be further understood from the following description with reference to the drawings, in which the same references are used in the different figures to denote similar parts and in which.

Figure 1:
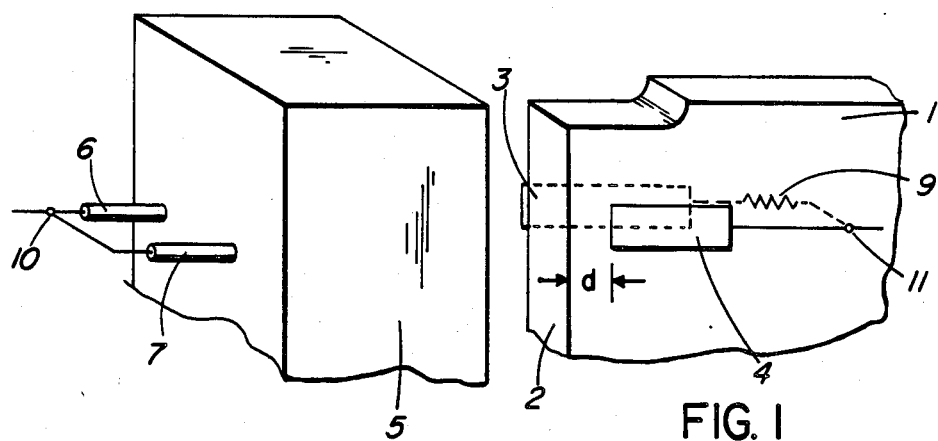
FIG. 1 is a partly schematic and partly diagrammatic illustration of part of a PCB and connector arrangement embodying the present invention.

Referring to FIG. 1, a double-sided PCB 1 having a connection edge 2 along the opposite sides of which are provided edge connection pads 3 and 4 is arranged, for example being slidable on rails not shown, to be removably received in a fixed connector 5 having contact pins 6 and 7. When the PCB is received in the connector, the pad 3 makes a first electrical connection with the contact pin 6, and the pad 4 makes a second electrical connection with the contact pin 7. The pad 3 extends to the edge 2 of the PCB 1, whereas the pad 4 stops short, by a distance d of the edge 2, so that the first electrical connection is always made before and broken after the second electrical connection, on insertion and removal, respectively, of the PCB from the connector. The distance d is for example in the range from 0.25 to 2.5 mm, typically 1.25 mm, for a connector contact insertion depth of up to about 6 mm.

As illustrated schematically in FIG. 1, arcing between the contact pin 7 and the pad 4 is avoided by providing the first electrical connection, in series with a current-limiting resistor 9 of suitable value such as 220 ohms, in parallel with the second electrical connection when the PCB 1 is received in the connector 5. Thus the pin 7 is connected to the pin 6 as shown via a connection 10, and the pad 3 is connected via the resistor 9 to the pad 4 as shown via a connection 11, to provide an arc-suppressed connection arrangement between the connections 10 and 11.

Thus the pin 6, pad 3, and resistor 9 avoid arcing on insertion of the PCB 1 into the connector 5 and on removal of the PCB from the connector, but are shorted via the pin 7 and pad 4 so that they have no effect when the PCB is fully received in the connector.

Figure 2:
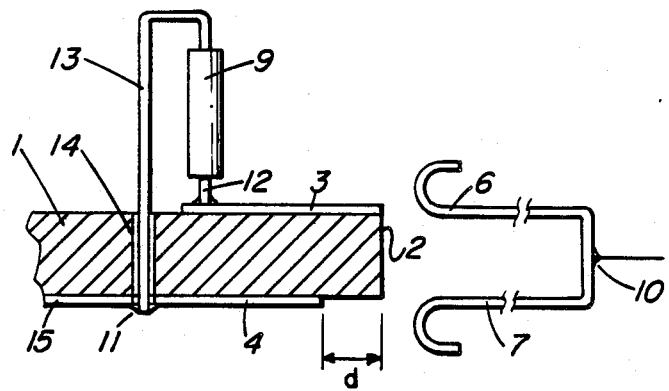
FIG. 2 is a cross-sectional illustration of part of another PCB and connector arrangement.

FIG. 2 illustrates an alternative arrangement in which the individual contact pins 6 and 7 in FIG. 1 are replaced by electrically and mechanically connected arms 6 and 7 of a bifurcated electrical connection. As shown in FIG. 2, the resistor 9 can be conveniently mounted on the PCB 1 with one terminal wire 12 connected to the pad 3 and the other terminal wire 13 extending through a hole 14 in the PCB and connected at the connection 11 to the pad 4, from which a printed conductive track 15 leads to other parts (not shown) of the PCB.

Figure 3:
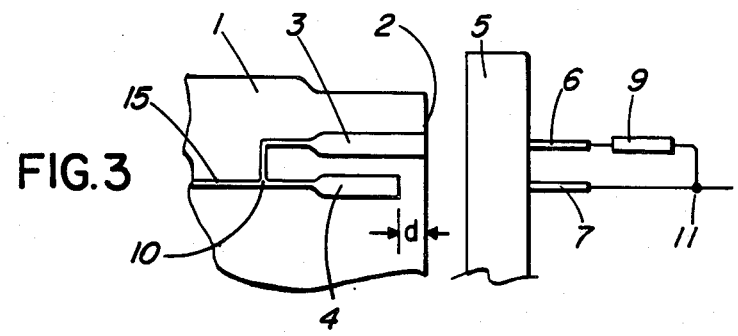
FIG. 3 is a plan view of part of a further PCB and connector arrangement.

In the arrangements of FIGS. 1 and 2 the pads 3 and 4 overlie one another on opposite sides of a double-sided PCB. FIG. 3 illustrates an alternative arrangement for a single or double-sided PCB in which the pads 3 and 4 are on the same side of the PCB 1 and are adjacent to one another, the contact pins 6 and 7 of the connector 5 being correspondingly positioned. FIG. 3 also shows that, instead of the arrangement in FIGS. 1 and 2, the pads 3 and 4 can be directly interconnected and the pins 6 and 7 can be connected via the current-limiting resistor 9. Obviously, the resistance of the resistor 9 could alternatively be provided partly on the connector 5 side, and partly on the PCB 1 side, of the electrical connection.

Figure 4:
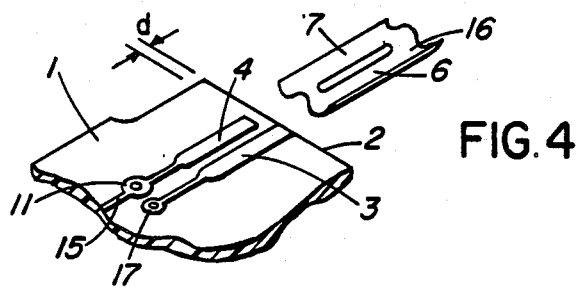
FIG. 4 is an illustration of part of yet another PCB and connector arrangement.

FIG. 4 illustrates a further arrangement for a single or double-sided PCB 1 in which the pads 3 and 4 are adjacent to one another on the same side of the PCB, to be contacted respectively by the contact pins 6 and 7 which in this case are constituted by laterally bifurcated arms of a single contact member 16. The current-limiting resistor 9, not shown in FIG. 4, is connected between the pads 3 and 4 via connections 11 and 17.

Although the above description and the drawings relate to only a single electrical connection between the connections 10 and 11, the same or similar arrangements can be provided in respect of a plurality of connections between a PCB and a connector. The current-limiting resistor 9 could, if desired, be replaced by a more complex current-limiting arrangement or device, and the positions of the pads 3 and 4 relative to one another, and thus the relative positions of the contact pins 6 and 7, can be arbitrarily selected. Thus numerous modifications, variations, and adaptations may be made to the particular described arrangements without departing from the scope of the invention, which is defined in the claims.

What is claimed is:

1. A printed circuit board edge connection arrangement comprising a printed circuit board having first and second edge connection pads and a connector for removably receiving the board, the connector including a first contact for making a first electrical connection to the first pad, and a second for making a second electrical connection to the second pad, when the board is received in the connector, wherein the second pad does not extend as far towards the connection edge of the printed circuit board as the first pad, whereby the first contact makes the first electrical connection to the first pad on insertion of the board into the connector before the second contact makes the second electrical connection to the second pad, and the first contact breaks the first electrical connection to the first pad on removal of the board from the connector after the second contact breaks the second electrical connection to the second pad, and current-limiting means, connected between the first and second pads or between the first and second contacts, via which the first electrical connection is connected in parallel with the second electrical connection when the board is received in the connector, whereby arcing between the second contact and the second pad, on insertion of the board into and removal of the board from the connector, is avoided.

2. An arrangement as claimed in claim 1 wherein the first and second pads overlie one another on opposite sides of the printed circuit board.

3. An arrangement as claimed in claim 1 wherein the first and second pads are adjacent to one another on the same side of the printed circuit board.

4. An arrangement as claimed in claim 1, 2, or 3 wherein the current-limiting means comprises a resistor.

5. An arrangement as claimed in claim 1, 2, or 3 wherein the current-limiting means comprises a resistor connected between the first and second pads, and a direct electrical connection between the first and second contacts.

6. An arrangement as claimed in claim 1, 2, or 3 wherein the current-limiting means comprises a resistor connected between the first and second contacts, and a direct electrical connection between the first and second pads.

* * * * *